US007167185B1

(12) United States Patent
Yiin et al.

(10) Patent No.: US 7,167,185 B1
(45) Date of Patent: Jan. 23, 2007

(54) VISUALIZATION OF PHOTOMASK DATABASES

(75) Inventors: Lih-Huah Yiin, Mountain View, CA (US); Yen-Wen Lu, Los Altos, CA (US); George Q. Chen, Fremont, CA (US)

(73) Assignee: KLA- Tencor Technologies Corporation, San Jose, CA (US)

( * ) Notice: Subject to any disclaimer, the term of this patent is extended or adjusted under 35 U.S.C. 154(b) by 844 days.

(21) Appl. No.: 10/396,228

(22) Filed: Mar. 24, 2003

Related U.S. Application Data (60) Provisional application No. 60/367,143, filed on Mar. 22, 2002.

(51) Int. Cl.
*G09G 5/02* (2006.01)
(52) U.S. Cl. .................. 345/596; 345/590; 382/149
(58) Field of Classification Search ............... 345/590, 345/596
See application file for complete search history.

(56) References Cited

U.S. PATENT DOCUMENTS

| | | | |
|---|---|---|---|
| 4,985,927 A * | 1/1991 | Norwood et al. ........... 382/149 |
| 4,991,977 A | 2/1991 | Manns et al. |
| 5,283,596 A | 2/1994 | Long |
| 5,303,334 A | 4/1994 | Snyder et al. |
| 5,533,170 A | 7/1996 | Teitzel et al. |
| 5,542,031 A | 7/1996 | Douglass et al. |
| 5,608,453 A | 3/1997 | Gerber et al. |
| 5,715,021 A | 2/1998 | Gibeau et al. |
| 5,729,637 A | 3/1998 | Nicholson et al. |
| 5,740,279 A | 4/1998 | Wang et al. |
| 5,805,178 A | 9/1998 | Silverbrook |
| 5,862,257 A | 1/1999 | Sekine et al. |
| 5,987,221 A | 11/1999 | Bearss et al. |
| 5,990,925 A | 11/1999 | Sousa et al. |
| 5,999,649 A | 12/1999 | Nicholson et al. |
| 6,057,853 A | 5/2000 | Siegel et al. |
| 6,104,374 A | 8/2000 | Sullivan et al. |
| 6,188,385 B1 | 2/2001 | Hill et al. |
| 6,278,434 B1 | 8/2001 | Hill et al. |
| 6,285,488 B1 | 9/2001 | Sandstrom |

(Continued)

OTHER PUBLICATIONS

Sengupta et al., Automated Evaluation of Critical Features in VLSI Layouts Based on Photolithographic Simulations, 1997, IEEE, pp. 482-494.*

(Continued)

*Primary Examiner*—Kee M. Tung
*Assistant Examiner*—Motilewa Good-Johnson
(74) *Attorney, Agent, or Firm*—Beyer Weaver & Thomas LLP (57) ABSTRACT

Faster and more accurate techniques for displaying images are described. The techniques can be applied in various applications that include semiconductor fabrication processes. The invention uses preprocessed images to generate a user-selected image in order to increase the speed of image processing. The invention displays the pixels forming an image using grayscale shading in order to improve the accuracy of displaying the patterns used in photolithography processes. The techniques of the present invention can be used to display images that represent lithography patterns stored within memory devices or to display images captured by inspection or metrology devices.

9 Claims, 5 Drawing Sheets

U.S. PATENT DOCUMENTS

| | | | |
|---|---|---|---|
| 6,297,879 B1 * | 10/2001 | Yang et al. | 356/237.5 |
| 6,307,566 B1 | 10/2001 | Hill et al. | |
| 6,800,927 B2 * | 10/2004 | Noble et al. | 257/628 |
| 6,813,062 B2 * | 11/2004 | Sandstrom | 359/292 |
| 6,898,305 B2 * | 5/2005 | Hiroi et al. | 382/149 |
| 6,921,905 B2 * | 7/2005 | Shishido et al. | 250/372 |
| 6,975,754 B2 * | 12/2005 | Hiroi et al. | 382/149 |

OTHER PUBLICATIONS

Luo et al., The integration of 3D digitizing and LCD panel display based on rapid prototyping system for manufacturing automation, 2000, IEEE, pp. 1255-1260.*

* cited by examiner

VISUALIZATION OF PHOTOMASK DATABASES

CROSS REFERENCE TO RELATED APPLICATIONS

This application claims priority of U.S. Provisional Patent Application No. 60/367,143, filed 22 Mar. 2002, which application is incorporated herein by reference in its entirety for all purposes.

FIELD OF THE INVENTION

The present invention relates generally to image rendering techniques, and more specifically to using such techniques in the field of semiconductor fabrication.

BACKGROUND OF THE INVENTION

The industry of semiconductor manufacturing involves highly complex techniques for integrating circuits into semiconductor materials. One of the techniques includes photolithography, which involves using a combination of etching and deposition processes to transfer patterns from a photomask or reticle to a layer of photoresist. The patterned photoresist layers are used to selectively etch semiconductor substrates that form the IC devices. A typical photomask, or light-blocking mask, is made of a quartz (glass) substrate that supports a patterned layer of opaque material, such as chrome. For instance, one type of light blocking mask is a phase shift mask, or PSM. Other types of masks include advanced phase shift masks, such as embedded attenuating phase shift masks (EAPSM) and alternating phase shift masks (APSM).

Due to the large scale of circuit integration and the decreasing size of semiconductor devices, the semiconductor manufacturing process is prone to processing defects. Inspection and test procedures are therefore critical for quality control purposes. Specific inspection and testing procedures have been developed for the photolithography processes. Current techniques for inspecting a photomask involve obtaining and displaying binary images of the patterns within the photomask or photoresist. Binary images contain individual pixels that are one of two shades, typically black or white. In some instances, the image of a portion of the photomask pattern maps to less than an entire pixel on a display screen. The specific binary display technique either displays such a pixel as black or white. Unfortunately, an inspection operator is unable to determine the shape, size, etc. of the portion of the photomask within this pixel. As a result, the binary image representation technique is limited in its ability to describe the shape and dimensions of a photolithography pattern. As such, current photomask inspection processes could be improved by overcoming this limitation.

Current display techniques are also commonly limited in the speed with which representations can be displayed. Specifically, large-scale (low magnification) representations of photolithography patterns require large amounts of memory, processing power, and processing time because such representations involve rasterizing each of the many features within a pattern. The slow speed of image rasterizing can require inspection processes to be performed off-line from a semiconductor fabrication process. This in turn can reduce the final total yield for a fabrication process. Since, the semiconductor industry constantly strives for increased yields, it would be very beneficial to develop faster photolithography pattern imaging techniques.

In sum, current photolithography inspection techniques can be improved in the aspects of speed and accuracy.

BRIEF SUMMARY OF THE INVENTION

The described invention is directed to faster and more accurate techniques for displaying images. The techniques can be applied in various applications that include semiconductor fabrication processes. The invention uses preprocessed images to generate a user-selected image in order to increase the speed of image processing. The invention displays the pixels forming an image using grayscale shading in order to improve the accuracy of displaying the patterns used in photolithography processes. The techniques of the present invention can be used to display pattern data in IC design databases.

As a method, one embodiment of the present invention includes at least storing a representation of the image in a database together with at least one additional representation of the image, receiving a request to render on the display screen at least a portion of the image, responsive to the request, selecting one of the stored representations of the image, and based on the selected representation of the image, rendering at least a portion of the image on the display screen.

As a method, another embodiment of the present invention includes at least receiving a representation of the photomask from a photomask database, mapping the representation to an array of pixels within the display screen, determining a feature ratio for each pixel that represents the area of each pixel to which one or more features of the photomask representation is mapped to the total area of each pixel, assigning a grayscale value to each pixel that corresponds to a respective feature ratio, and rendering the grayscale image based upon the grayscale values.

As a method, yet another embodiment of the present invention includes at least displaying an image according to one of two displaying algorithms. One of the algorithms is selected based upon the magnification level of the image selected by a user to be displayed.

As an apparatus, one embodiment of the present invention includes at least a computer apparatus suitable for implementing the technique of displaying an image based upon a preprocessed image.

As an apparatus, another embodiment of the present invention includes at least a computer apparatus suitable for generating a grayscale image of a photomask.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

Generally, the present invention relates to faster and more accurate techniques for displaying images. The techniques can be applied in various applications, however, the present discussion will concentrate on their use in applications relating to semiconductor fabrication processes. These image-displaying techniques are beneficial because they minimize the amount of time required for inspection processes and they increase the accuracy of the inspection processes. The invention uses preprocessed images to generate a user-selected image in order to increase the speed of image processing. The invention displays the pixels forming an image using grayscale shading in order to improve the accuracy of displaying the patterns used in photolithography processes. The techniques of the present invention can be used to display images that represent lithography patterns stored within memory devices (e.g., IC design databases) or to display images captured by inspection or metrology devices. These inspection and metrology devices include devices that are known in the art, such as scanning electron microscopes and optical inspection devices.

Figure 1:
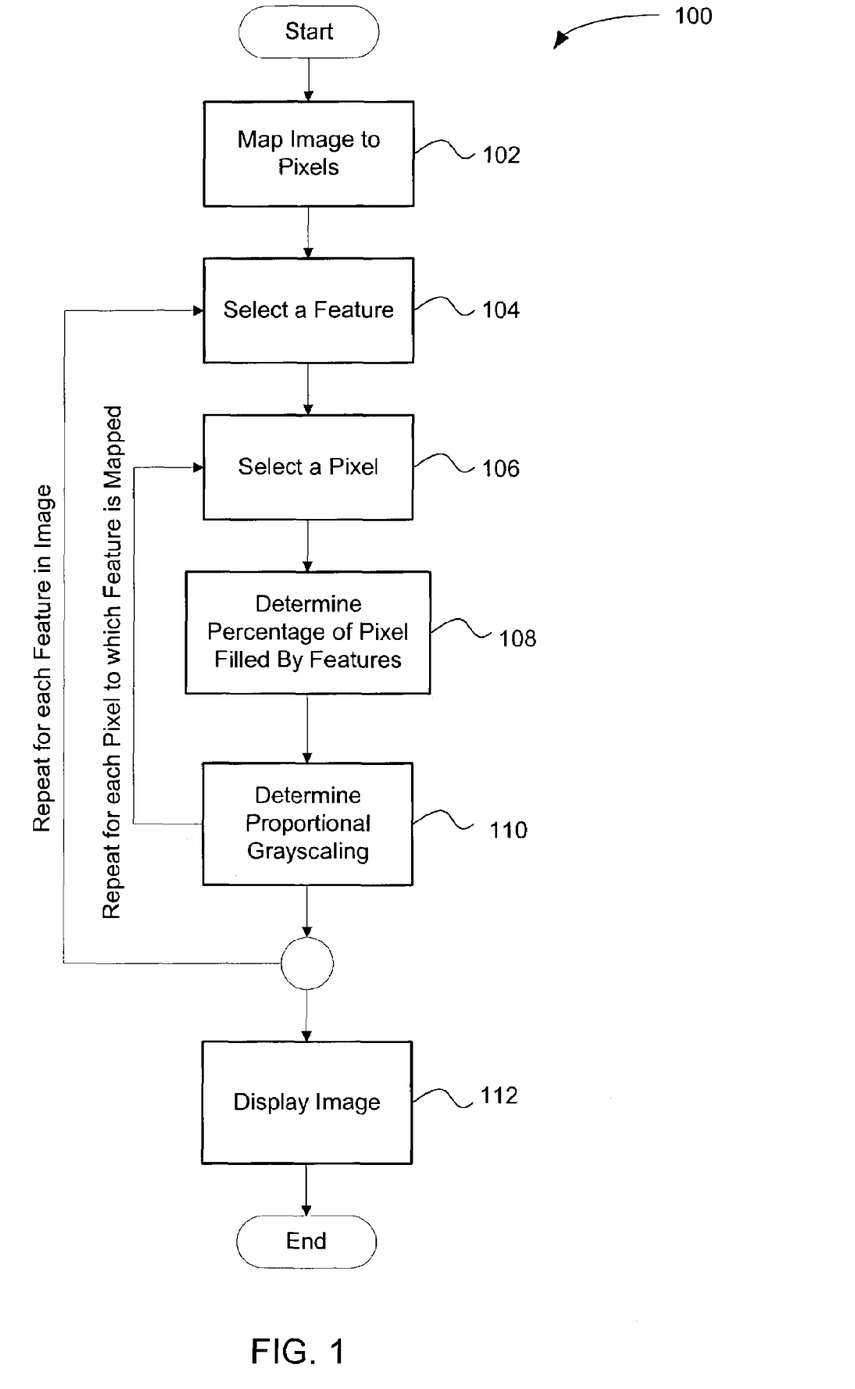
FIG. 1 illustrates a flowchart that describes the technique of using grayscale for displaying images of photolithography patterns according to one embodiment of the present invention.

The gray-scaling technique for accurately displaying patterns used for photolithography will now be described. This technique can also be referred to as anti-aliasing. FIG. 1 illustrates a flowchart 100 that describes the technique of using grayscale for displaying images of photolithography patterns according to one embodiment of the present invention. Flowchart 100 begins with block 102 where an image of a photolithography pattern is mapped to an array of pixels that will display the image. Mapping refers to the process of assigning each pixel to display a respective portion of the image to be displayed. For instance, a pixel can display a dark shading to represent a portion of a photolithography mask or it can display no shading at all to represent an empty space within the pattern. Images are represented on a two-dimensional coordinate space with a resolution higher than the discrete size of the pixels. A display screen becomes a virtual display plane, where points can be identified with sub-pixel accuracy. The fractional pixel accuracy in the display plane permits flexible and arbitrary mapping of an image to the display plane.

The present invention focuses upon the pixels of which only a portion is mapped to a feature. In some cases, a pixel can be assigned to represent portions of two different features from the image selection. With respect to these pixels, the invention proceeds to determine an appropriate gradation of shading to represent the ratio of the pixel to which a feature is mapped. In other words, rather than displaying a pixel that is shaded completely black or white, the invention uses a shading that can intuitively represent the amount of space that a feature occupies within a pixel.

The gray-scaling technique of flow chart 100 operates in an iterative manner in that it proceeds to determine the shading for the pixels by analyzing one feature at a time. Within each feature, the technique proceeds to analyze one pixel at a time. These iterative processes repeat until all of the features within the image to be displayed have been analyzed. A feature of a photolithography pattern can have various shapes and sizes; such shapes including rectangles, trapezoids, etc. The specific manner of iterating the functions of the gray-scaling technique can vary. For instance, the technique could simply analyze each pixel successively without regard to the features within the image. The explanation of gray-scaling technique 100 will now be described using the feature-by-feature iterative process.

After the mapping operation of block 102, a first feature is selected for gray-scale analysis in block 104. Then in block 106, a first pixel is selected for analysis. In block 108, the ratio, RA, of the area of the pixel to which a feature is mapped versus the area of the pixel to which no feature is mapped is determined. In other words, RA=(area of pixel mapped to a feature)/(total pixel area). For example, an RA of 1 corresponds to a pixel to which a feature is mapped to the entire pixel, an RA of 0 corresponds to a pixel to which no feature is mapped to it, an RA of ½ corresponds to a pixel to which one-half of the pixel is mapped to a feature, and so forth.

In one embodiment, estimation of feature areas mapped to a pixel is based upon geometric methods. For example, the area for which a feature overlaps a pixel is estimated with rectangles. The system needs to estimate feature areas because features tend to have curved boundaries, in addition to straight boundaries. Various estimation techniques can be used with the present invention.

In block 110, a particular level of shading is designated for the pixel as determined by the ratio generated in block 108. A scale from 0 to $2^n-1$ represents the level of shading for a pixel where n represents the number of bits used to store the level of shading. Typically, 0 represents no shading and $2^n-1$ represents the heaviest level of shading, e.g., black. The particular level of shading is generated by multiplying RA by $2^n-1$. For instance, when 8 bits are available to store the level of shading for each pixel, a particular shading level is generated by multiplying 255 by RA. When block 110 is completed, an iterative loop causes the technique to repeat blocks 106 through 110 for each of the pixels to which a particular feature is mapped. When the pixels for a first feature are completely analyzed, the process 100 is looped back to block 104 to select the next feature for analysis.

After all of the features within the image are analyzed, the process flow proceeds to block 112 where the gray-scale image is produced on a display screen. After block 112, gray-scaling technique 100 is completed.

Figure 2:
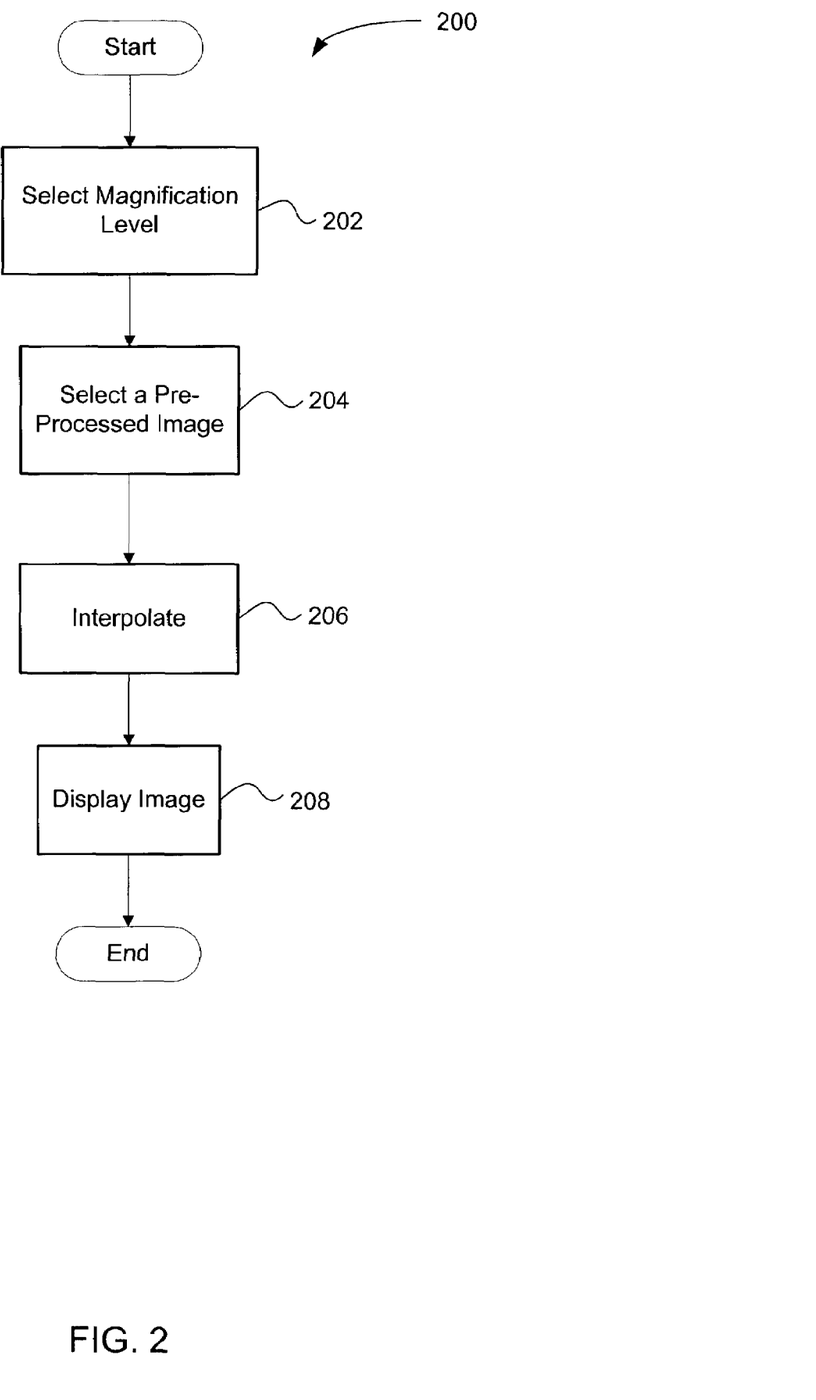
FIG. 2 illustrates flow chart, which describes the technique of using preprocessed images for creating images for display according to one embodiment of the present invention.

The technique of using preprocessed images to increase the speed of displaying images will now be described. FIG. 2 illustrates flow chart 200, which describes the technique of using preprocessed images for creating images for display. Increasing the speed of displaying images provides benefits such as real-time visualization of photolithography patterns during semiconductor fabrication. Flow chart 200 begins at block 202 with a typical operation where a user selects a specific area of an image for magnified viewing. A user can make a selection through various methods provided through a graphical user interfaces (GUI). For instance, a box can be dragged over a desired area for magnified viewing. Or a user can type in specific coordinate and magnification level selections.

In block 204, one or more preprocessed images are selected in order to generate an image as desired by the user. In block 206, an image is generated from the one or more of the selected preprocessed images by interpolation. In block 208, the newly generated image is displayed on a display screen.

A preprocessed image is an image that is ready for display because the processing required for displaying the image has already been performed. Such preprocessing includes mapping of an image to the pixels as described above. In some embodiments, preprocessing can involve the operations shown in FIG. 1, which involve grayscaling. In other words, grayscaling of the pixels is not required but can be beneficial to preprocess the images. The preprocessed images include various representations of a photolithography pattern. In one embodiment, each preprocessed image corresponds to various magnifications of a pattern. For example, an inspection system could store four preprocessed images of a lithography pattern, each at a magnification level of 1, 2, 4, and 8, respectively. The number preprocessed images and the magnification level of each can vary depending upon system requirements. In other embodiments, each preprocessed image corresponds to views of magnifications from different perspectives.

In block 204, the selection of the one or more preprocessed images is based upon the specific algorithm used. The following description describes the algorithm for selecting preprocessed images where each image has a different magnification level. This algorithm, however, can be easily modified for preprocessed images of different types. Therefore, for purposes of this description, it is assumed there are a discrete number of preprocessed images where each image is magnified to a respective degree. The algorithm selects one or more preprocessed images depending upon the magnification level corresponding to the user selection with respect to the magnification level of each of the preprocessed images.

In one case, the user selects a portion of an image to display that requires a magnification level that is within a certain standard deviation from the magnification level of one of the preprocessed images. In this case, the preprocessed image having a magnification level that is sufficiently close to the user selected level of magnification is used to display the portion of the pattern selected by the user. In this case, the speed of inspection is greatly increased since the image to be displayed needed no preprocessing after the time the user selection was made.

In another case the user selects a portion of an image requiring a magnification level that is outside of a standard deviation from any of the magnification levels for all of the preprocessed images. Also in this case, the user selected magnification level is between that of any two preprocessed image magnification levels. In this case, a couple of alternative steps can be taken. First, an algorithm step could select both of the preprocessed images that have magnification levels closest to the user selected magnification level. Then in block 206, an image corresponding to the user selection can be generated by interpolating from each of the preprocessed images. A second algorithm step could select a single preprocessed image having the closest magnification level that is less than the user selected magnification level. Then in block 206, an image corresponding to the user selection can be generated by interpolating from the single preprocessed image.

In another case, when the user selects a magnification level above that of the highest preprocessed image magnification level, the algorithm can select from several display options. First, the algorithm can select and interpolate (up-sample) the preprocessed image having the highest level of magnification. Alternatively, the algorithm can simply display the image having the highest level of magnification. Alternatively, the algorithm can proceed to process an image with the user selected magnification level without use of the preprocessed images.

In a similar fashion, when the user selects a magnification level below that of the lowest preprocessed image magnification level, the algorithm can select from several display options. First, the algorithm can select and display the preprocessed image having the lowest level of magnification. Alternatively, the algorithm can proceed to decimate (down sample) from this preprocessed image. Alternatively, the algorithm can proceed to process an image with the user selected magnification level without use of the preprocessed images.

In some embodiments, the algorithm can display the original image of the lithographic pattern when a user selected magnification level is above the threshold for all of the preprocessed images.

In block 206, interpolation is performed from the one or more preprocessed images selected in block 204. Various interpolation techniques, as known in the art, can be used. Such algorithm techniques can be selected based upon the sophistication of interpolation required by a specific implementation of the invention. For example, linear interpolation can be used.

The technique of flow diagram 200 is particularly advantageous when displaying images of a photolithography pattern at low magnifications. At low magnifications, an extremely high number of features are to be displayed and therefore require a lot of memory and processing power. The preprocessed images therefore completes the required processing before inspection processes begin so that only interpolation techniques are required for user viewing during inspection processes.

The preprocessed images can be generated in a variety of ways. For instance, each preprocessed image can be individually processed. Alternatively, an image having a relatively high magnification level can be generated and then lower magnification level images can be easily generated by a down-sampling technique. The appropriate down-sampling technique can be selected from the many techniques known in the art.

An additional technique for increasing the speed of displaying images involves the use of disk or memory cache. For instance, the image at a certain magnification level can be cached so that a user can scroll to a portion of a magnified image that is off a display screen, when the image are larger than the display screen. If a server hosts the photomask database and the client is at a remote site, the representation of the image may be cached at the client site to enable such scrolling in real time. The complete image could be processed by the server and transmitted to the client.

Figure 3:
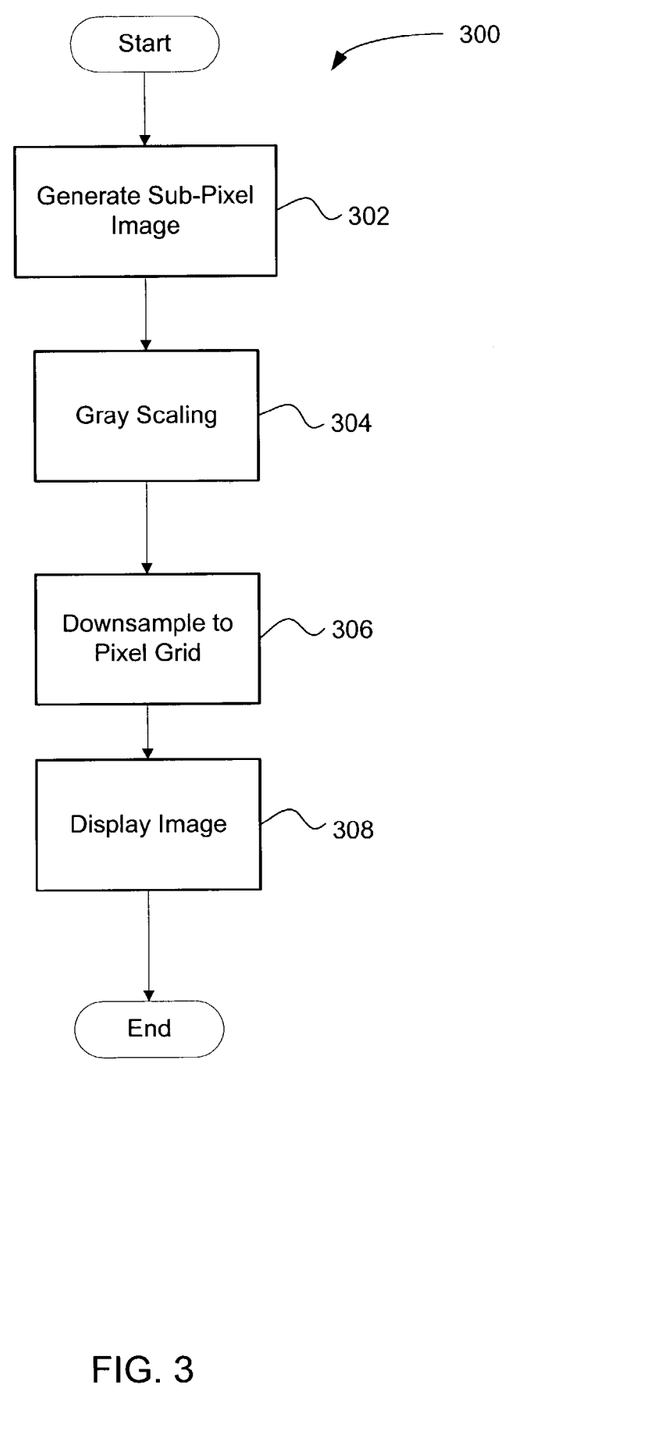
FIG. 3 illustrates a flow chart describing an image processing technique to display a photomask database that uses gray scaling according to one embodiment of the invention.

The discussion will now go on to describe another image processing technique that involves gray scaling. This technique is described in FIG. 3. FIG. 3 illustrates a flow chart 300 describing an image processing technique to display a photomask database that uses gray scaling according to one embodiment of the invention. In one embodiment, the technique of FIG. 3 is suitable for generating images at high magnification levels, e.g., where each pixel represents less than a 2×2 um² area of an inspected specimen.

The technique of flow chart 300 begins in block 302 by generating a binary image of a pattern feature at the sub-pixel level. This is performed by sub-dividing each pixel into an array of sub-pixels arranged in rows and columns. The number of sub-pixels depends upon the resolution desired by the inspection system. Typically, each pixel can be divided into an 8×8 array of sub-pixels. Block 302 is repeated until a sub-pixel level image is created for each feature within an image.

After the binary image at the sub-pixel level is generated, gray scaling is performed in block 304. Gray scaling can be performed using a low-pass filter as is known in the art.

Then in block 306, the sub-pixel level image is downsampled so that the image can be displayed on a display screen made up of pixels. Any of a variety of the known downsampling techniques can be used in block 306. In block 308, the downsampled image is displayed on a display screen.

The sub-pixel resolution of block 302 and gray-scaling technique of block 304 improve the accuracy of the displayed image with respect to various measurements. For example, the location of edges within a photomask pattern can be more accurately located, and line width measurements are more accurate.

Figure 4:
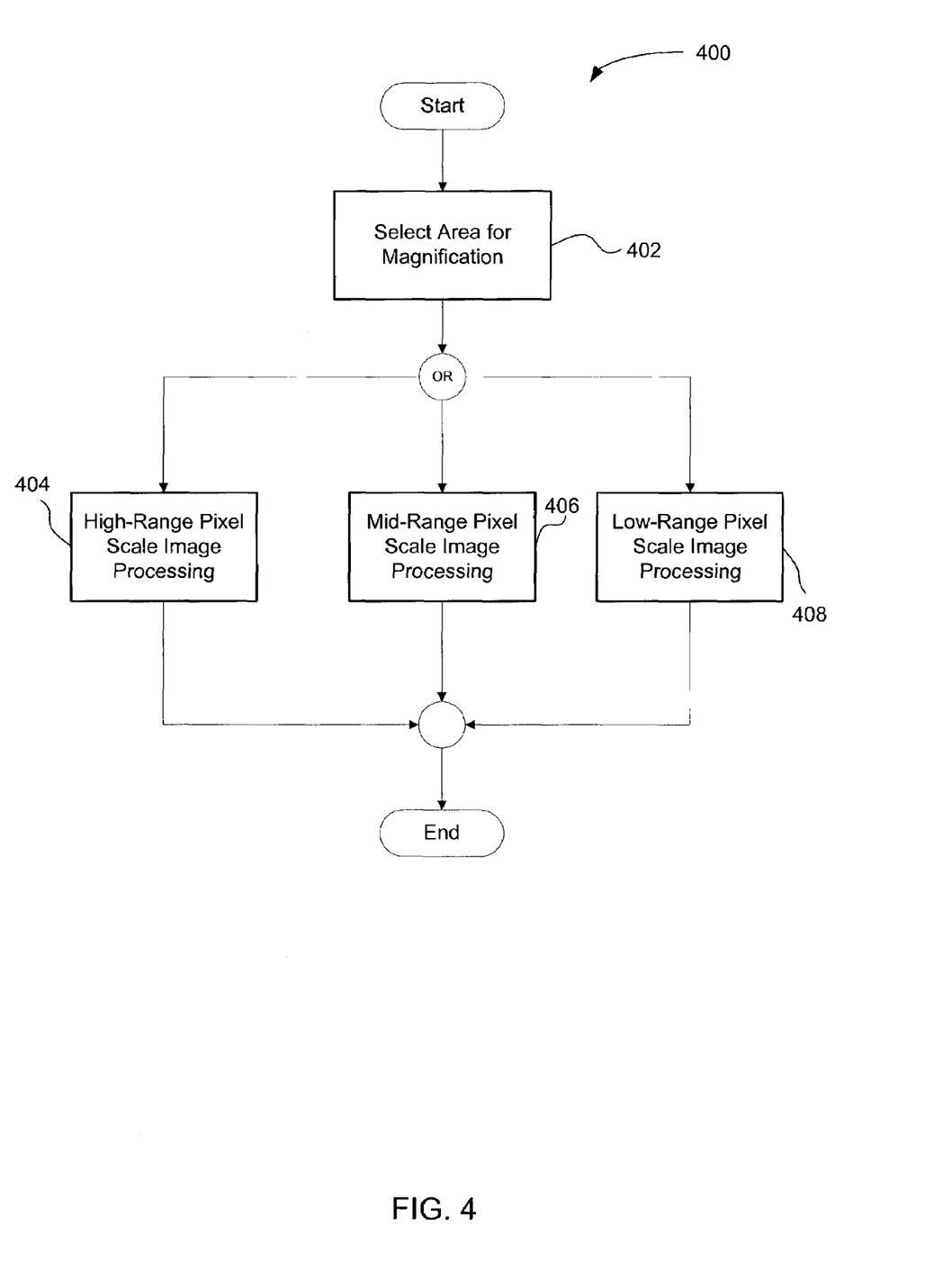
FIG. 4 illustrates a flow chart, which describes the alternative image processing techniques that can be implemented by a single image processing system according to one embodiment of the present invention.

A system that incorporates various image-processing techniques described in the present disclosure will now be described. FIG. 4 illustrates a flow chart 400, which describes the alternative image processing techniques that can be implemented by a single image processing system according to one embodiment of the present invention. The process of flow chart 400 enables an inspection system to utilize various image-processing techniques to optimize processing time and accuracy depending upon factors such as the magnification level selected by a user.

FIG. 4 begins with block 402 where a user selects a portion of an original image for magnified viewing. Then, depending upon certain criteria, one of the image-processing techniques of block 404, 406, or 408, is selected to generate the image selected by the user. In one embodiment, as represented in FIG. 4, the criteria for selecting the appropriate image processing technique is dependent upon the dimensions represented by each pixel.

When the user selects an image to have a low magnification wherein each pixel represents relatively large dimensions, block 404 is selected to generate the selected image. Block 404, the high-range pixel scale image processing block, uses the image processing technique of FIG. 2. The technique of FIG. 2 is appropriate given the large amount of data required to display images having large pixel sizes. In some embodiments, block 404 is selected when the pixels represent actual dimensions of 8 um or greater. These pixel sizes correspond approximately to magnifications of less than 20×. The pixel size criteria for selecting function block 404, and block 406 and 408, can vary.

When the user selects an image to have a mid-range of magnification, block 406 is selected to generate the selected image. Block 406, the mid-range pixel scale image processing block, uses the image processing technique of FIG. 1. In some embodiments, block 406 is selected when the pixels represent actual dimensions of approximately between 2 and 8 um. These pixel sizes correspond approximately to magnifications of between 20–80×.

When the user selects an image to have a low-range of magnification, block 408 is selected to generate the selected image. Block 408, the low-range pixel scale image processing block, uses the image processing technique of FIG. 3. In some embodiments, block 408 is selected when the pixels represent actual dimensions of approximately less than 2 um. These pixel sizes correspond approximately to magnifications of 80×.

The image processing techniques described in this disclosure can manipulate the image data in manners to display the image in different ways that are useful to a user. One way is to rotate the displayed image. This can be performed in response to a user's selected point of rotation and an angle of rotation. The user can enter this information explicitly, e.g. through a keyboard, or by using a mouse. Rotation may be achieved in the process of figure rasterization or using rotation matrices when the image is displayed. The techniques of this invention can also manipulate the images to be flipped so that mirror images of an original image can be displayed. The user can select the axis about which the image will be flipped. A user can also choose to both flip and rotate an image. The present invention can also perform by other image manipulations similar to those found in current computer aided design software packages to further facilitate a semiconductor inspection process.

The inspection technique of the present invention can display multiple images. In one embodiment, the techniques employs multiple colors to display multiple images on a screen wherein each image corresponds to a respective layer of a multi-layered photomask (e.g., a phase shift mask). An embodiment of the invention preprocesses each layer of the multi-layered photomask to produce a corresponding grayscale value for each pixel on the screen corresponding to that layer. The system then assigns different colors to each representation of each pixel corresponding to different layers. In this case, an identical grayscale value for a particular pixel corresponding to two different layers would be assigned different colors to permit differentiation between the layers.

Computer System Embodiment

Figure 5:
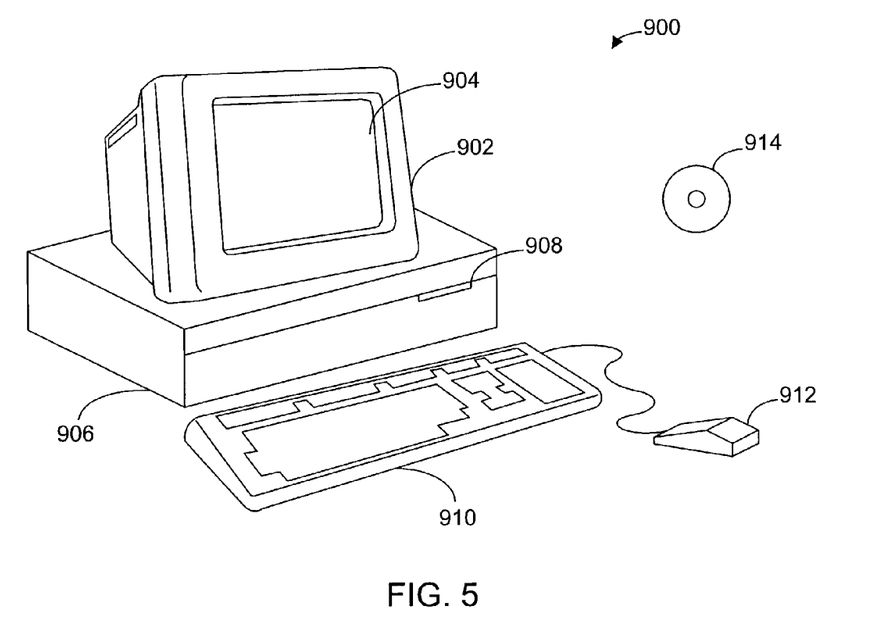
FIGS. 5 and 6 illustrate a computer system suitable for implementing embodiments of the present invention.
Figure 6:
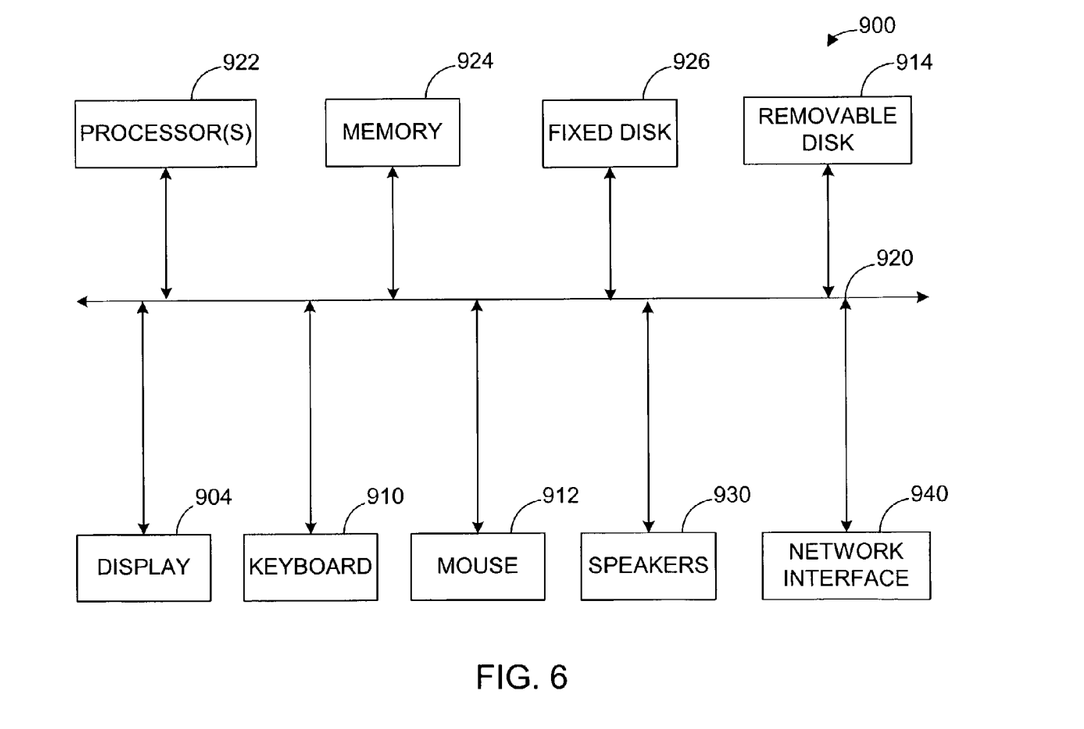

FIGS. 5 and 6 illustrate a computer system 900 suitable for implementing embodiments of the present invention. FIG. 5 shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 6 is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

A networked embodiment of the present invention can include one or more servers that are connected to one or more client sites. In some embodiments the server(s) would perform the calculation intensive operations such as generating the preprocessed images and the run-time rasterization. These images would then be transmitted to the client sites for viewing and analysis. As mentioned above, caching techniques can aid the client sites in their speed of displaying images.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for displaying a grayscale image of a photolithography photomask on a display screen comprising:

receiving a representation of the photomask from a photomask database;

mapping the representation to an array of pixels within the display screen;

determining a feature ratio for each pixel that represents the area of each pixel to which one or more features of the photomask representation is mapped to the total area of each pixel;

assigning a grayscale value to each pixel that corresponds to a respective feature ratio;

rendering the grayscale image based upon the grayscale values;

and displaying the rendered grayscale image.

2. A method as recited in claim 1 wherein the determining and assigning operations are iteratively performed for each feature of the image to be displayed until a grayscale value has been assigned to the pixels for every feature within the image to be displayed.

3. A method as recited in claim 1 wherein the grayscale value is between the range of zero and ($2^n-1$), wherein n equals the number of bits used to store the grayscale value.

4. A method as recited in claim 1 wherein the determining and assigning operations are performed at a server computing device and the rendering operation is performed at a remote client site.

5. A method for displaying an image of a photolithography photomask on a display screen comprising:

receiving a request to render on the display screen at least a portion of the image wherein the request requires the portion of the image to be displayed at a desired magnification level;

displaying the portion of the image according to a first algorithm when the desired magnification level is within a first magnification range, the first algorithm comprising, storing a representation of the image in a database together with at least one additional representation of the image;

selecting one of the stored representations of the image; and based on the selected representation of the image, rendering at least a portion of the image on the display screen;

displaying the portion of the image according to a second algorithm when the desired magnification level is within a second magnification range, the second algorithm comprising, receiving the representation of the photomask from a photomask database;

mapping the representation to an array of pixels within the display screen;

determining a feature ratio for each pixel that represents the area of each pixel to which one or more features of the photomask representation is mapped to the total area of each pixel;

assigning a grayscale value to each pixel that corresponds to a respective feature ratio; and rendering the grayscale image based upon the grayscale values.

6. A method as recited in claim 5 wherein the first magnification range corresponds to pixels sizes in the range of approximately greater than 8 um and the second magnification range corresponds to pixel sizes in the range of approximately 2–8 um.

7. A method as recited in claim 5 wherein the portion of the image is displayed according to a third algorithm when the desired magnification level is within a third magnification range, the third algorithm comprising:
   creating a binary image of the photomask at a sub-pixel level wherein each pixel of the display screen is subdivided into an array of sub-pixels;
   antialiasing the binary image at the sub-pixel level to create an antialiased image;
   downsampling the antialiased image to create a downsampled image suitable for display on the display screen; and
   rendering the downsampled image on the display screen.

8. A method as recited in claim 7 wherein the third magnification range corresponds to pixel sizes in the range of approximately less than 2 um.

9. A computer apparatus for use in displaying a grayscale image of a photolithography photomask on a display screen, said computer apparatus comprising:

an input/output device for receiving a representation of the photomask from a photomask database; and a processor unit configured to map the representation to an array of pixels within the display screen, determine a feature ratio for each pixel that represents the area of each pixel to which one or more features of the photomask representation is mapped to the total area of each pixel, assign a grayscale value to each pixel that corresponds to a respective feature ratio, and render the grayscale image based upon the grayscale values, wherein the processor unit is in communication with the input/output device.

* * * * *